US008890625B2

(12) United States Patent
Chang et al.

(10) Patent No.: US 8,890,625 B2
(45) Date of Patent: Nov. 18, 2014

(54) SYSTEMS AND METHODS FOR FREQUENCY SYNTHESIS TO IMPROVE COEXISTENCE

(71) Applicant: QUALCOMM Incorporated, San Diego, CA (US)

(72) Inventors: Richard Chang, Sunnyvale, CA (US); Tomas O'Sullivan, Burlingame, CA (US); Cristian Marcu, San Francisco, CA (US); Brian Kaczynski, Krakow (PL)

(73) Assignee: QUALCOMM Incorporated, San Diego, CA (US)

( * ) Notice: Subject to any disclaimer, the term of this patent is extended or adjusted under 35 U.S.C. 154(b) by 25 days.

(21) Appl. No.: 13/733,746

(22) Filed: Jan. 3, 2013

(65) Prior Publication Data

US 2014/0184342 A1    Jul. 3, 2014

(51) Int. Cl.
*H03L 7/085* (2006.01)
*H03L 7/099* (2006.01)
*H03B 21/02* (2006.01)
*H03L 7/18* (2006.01)
*H03L 7/06* (2006.01)

(52) U.S. Cl.
CPC  *H03L 7/06* (2013.01); *H03L 7/099* (2013.01); *H03B 21/02* (2013.01); *H03L 7/18* (2013.01)
USPC .............. 331/1 A; 331/179; 331/16; 332/127; 455/260; 375/376

(58) Field of Classification Search
CPC ............... H04B 1/40; H04B 1/50; H03D 3/24
USPC .................. 331/16, 34, 177 R, 179; 375/376; 455/260; 332/127
See application file for complete search history.

(56) References Cited

U.S. PATENT DOCUMENTS

| | | | | |
|---|---|---|---|---|
| 6,085,075 | A | * | 7/2000 | Van Bezooijen .............. 455/260 |
| 6,321,067 | B1 | | 11/2001 | Suga et al. |
| 7,130,603 | B2 | | 10/2006 | Futamura et al. |
| 7,171,182 | B2 | | 1/2007 | Filipovic |
| 7,480,343 | B2 | | 1/2009 | Eikenbroek et al. |
| 7,508,898 | B2 | * | 3/2009 | Cyr et al. ....................... 375/376 |

(Continued)

FOREIGN PATENT DOCUMENTS

WO        WO-03094377 A1    11/2003

OTHER PUBLICATIONS

Darabi H., et al., "A 2.4-GHz CMOS Transceiver for Bluetooth", IEEE Journal of Solid-State Circuits, IEEE Service Center, Piscataway, NJ, USA, vol. 36, No. 12, Dec. 1, 2001, XP011061648, ISSN: 0018-9200 Section !!.C. Clock Generator Architecture; figure 2.

(Continued)

*Primary Examiner* — Arnold Kinkead
(74) *Attorney, Agent, or Firm* — Bay Area Technology Law Group PC

(57) ABSTRACT

A frequency synthesizer for a WLAN transceiver is disclosed that may be used to generate 5.4 GHz and 2.4 GHz signals. The frequency synthesizer may be configured to minimize VCO pulling by using VCO operating frequencies that are not integer multiples of the RF bands. Further, the frequency synthesizer may be configured to minimize interference with other frequency bands used by existing wireless systems.

18 Claims, 3 Drawing Sheets

(56) References Cited

U.S. PATENT DOCUMENTS

| | | | |
|---|---|---|---|
| 7,546,102 | B2 | 6/2009 | Widerin |
| 7,772,932 | B1 | 8/2010 | Mack |
| 7,894,778 | B2 * | 2/2011 | Li .................................. 455/76 |
| 2012/0081155 | A1 | 4/2012 | Li et al. |

OTHER PUBLICATIONS

International Search Report and Written Opinion—PCT/US2013/020371—ISA/EPO—Aug. 23, 2013.
Shin H., et al., "A 1.8-V 6/9-GHz switchable dual-band quadrature LC VCO in SiGe BiCMOS technology", 2002 IEEE Radio Frequency Integrated Circuits (RFIC) Symposium. Digest of Papers. Seattle, WA, Jun. 2-4, 2002; [IEEE Radio Frequency Integrated Circuits Symposium], New York, NY: IEEE, US, Jun. 3, 2002, pp. 71-74, XP032408735, DOI: 10.1109/RFIC.2002.1011513, ISBN: 978-0-7803-7246-7, Section II. Architecture; figure 2.
Zhou J., et al., "A 0.4a 6GHz LO generation system using a dual-mode VCO for Software-Defined Radio", Solid-State and Itegrated Circuit Technology (ICSICT), 2010 10th IEEE International Conference on, IEEE, Piscataway, NJ, USA, Nov. 1, 2010, pp. 740-742, XP031835033, ISBN: 978-1-4244-5797-7 Section 2 .. Architecture and Frequency Planning; figures 1, 2.
Zargari M., et al., "A Dual-Band CMOS MIMO Radio SoC for IEEE 802.11n Wireless LAN," IEEE Journal of Solid-State Circuits, vol. 43 (12), pp. 2882-2895, Dec. 2008.

* cited by examiner

US 8,890,625 B2

SYSTEMS AND METHODS FOR FREQUENCY SYNTHESIS TO IMPROVE COEXISTENCE

FIELD OF THE PRESENT INVENTION

This disclosure generally relates to frequency synthesizers and more specifically to frequency synthesizers configured for use in wireless communication systems that reduce or minimize the generation of undesirable spurious frequencies.

BACKGROUND OF THE INVENTION

Wireless networks are increasingly employed to provide various communication functions including voice, video, packet data, messaging and the like. Depending upon the wireless communication system, it may be desirable to provide a transceiver capable of operating on more than one frequency band. To obtain this functionality, the transceiver may be designed to employ a frequency synthesizer that generates the requisite frequency for each band to convert between the carrier radio frequency (RF) and the baseband frequency. Further, the design of the transceiver may employ a direct conversion technique or may use one or more intermediate frequencies (IFs). To generate the necessary frequencies, the frequency synthesizer may employ phase locked loop (PLL) circuitry including a voltage controlled oscillator (VCO). The choice of transceiver architecture and the operational frequencies of the VCO used by the frequency synthesizer depends on balancing a number of design constraints. For example, it may be desirable to avoid operating the VCO at frequencies that are integer multiples of the carrier frequency in order to minimize pulling effects on the VCO. Further, the operation of the VCO may result in spurious signals that depend upon the VCO's frequency of operation.

Accordingly, this disclosure is directed to a frequency synthesizer for use in a wireless communications system operating on a plurality of frequency bands that generates more than one desired frequency and minimizes interference in other wireless communications systems.

SUMMARY OF THE INVENTION

This specification discloses systems for synthesizing frequencies, including a frequency synthesizer having a first voltage controlled oscillator (VCO) generating a signal having a first frequency, a first divide block, a first mixer, a second VCO generating a signal having a second frequency, a second divide block and a second mixer, wherein the signal from the first VCO is fed to the first divide block and to the first mixer, an output from the first divide block is fed to the first mixer and combined with the signal from the first VCO to generate a first synthesized signal having a frequency that is a non-integer multiple of the first frequency and wherein the signal from the second VCO is fed to the second divide block and to the second mixer, an output from the second divide block is fed to the second mixer and combined with the signal from the second VCO to generate a second synthesized signal having a frequency that is a non-integer multiple of the second frequency.

In one aspect, the frequency synthesizer may also include a first quadrature divide by two block and a second quadrature divide by two block, wherein the first synthesized signal is fed to the first quadrature divide by two block to generate a first in-phase (I) local oscillator signal at one-half the frequency of the first synthesized signal and a first quadrature (Q) local oscillator signal at one-half the frequency of the first synthesized signal and wherein the second synthesized signal is fed to the second quadrature divide by two block to generate a second I local oscillator signal at one-half the frequency of the second synthesized signal and a second Q local oscillator signal at one-half the frequency of the second synthesized signal. Further, the first and second divide blocks may be divide by three blocks. Additionally, the first I and Q local oscillator signals may each have a frequency ⅔ of the first frequency and wherein the second I and Q local oscillator signals may each have a frequency ⅔ of the second frequency. For operation, the first frequency may be in the range of approximately 7.35 GHz to 8.74 GHz and the second frequency may be in the range of approximately 3.6 GHz to 3.72525 GHz.

In another aspect, the frequency synthesizer may include a common regulatory path. Further, the common regulatory path may receive a first feed back signal from the first divide block and a second feed back signal from the second VCO.

In one embodiment, the second VCO may exhibit less phase noise than the first VCO. Further, the first VCO may have a first inductance and the second VCO may have a second inductance, such that the second inductance is less than the first inductance.

This disclosure is also directed to methods for synthesizing frequencies. In one embodiment, a suitable method may include the steps of generating a first signal having a frequency with a first VCO, dividing the first signal with a first divide block, mixing the first signal with an output of the first divide block to generate a first synthesized signal having a frequency that is a non-integer multiple of the frequency of the first signal, generating a second signal having a frequency with a second VCO, dividing the second signal with a second divide block, and mixing the second signal with an output of the second divide block to generate a second synthesized signal having a frequency that is a non-integer multiple of the frequency of the second signal. The method may also include dividing the first synthesized signal with a first quadrature divide by two block to generate a first in-phase (I) local oscillator signal at one-half the frequency of the first synthesized signal and a first quadrature (Q) local oscillator signal at one-half the frequency of the first synthesized signal and dividing the second synthesized signal with a second quadrature divide by two block to generate a second I local oscillator signal at one-half the frequency of the second synthesized signal and a second quadrature Q local oscillator signal at one-half the frequency of the second synthesized signal. Further, dividing the first signal with the first divide block and dividing the second signal with the second divide block may include dividing by three. Additionally, dividing the first synthesized signal with the first quadrature divide by two block may generate first I and Q local oscillator signals at ⅔ of the frequency of the first signal and dividing the second synthesized signal with the second quadrature divide by two block may generate second I and Q local oscillator signals at ⅔ of the frequency of the second signal. In operation, the first frequency may be in the range of approximately 7.35 GHz to 8.74 GHz and the second frequency may be in the range of approximately 3.6 GHz to 3.72525 GHz.

One aspect includes controlling the first and second VCOs with a common regulatory path. In such embodiments, a first feed back signal for the common regulatory path may be taken from the first divide block and a second feed back signal for the common regulatory path may be taken from the second VCO.

In another aspect, the second VCO may exhibit less phase noise than the first VCO. Further, the first VCO may have a first inductance and the second VCO may have a second inductance, such that the second inductance is less than the first inductance.

BRIEF DESCRIPTION OF THE DRAWINGS

Further features and advantages will become apparent from the following and more particular description of the preferred embodiments of the invention, as illustrated in the accompanying drawings, and in which like referenced characters generally refer to the same parts or elements throughout the views, and in which.

DETAILED DESCRIPTION OF THE INVENTION

Figure 1:
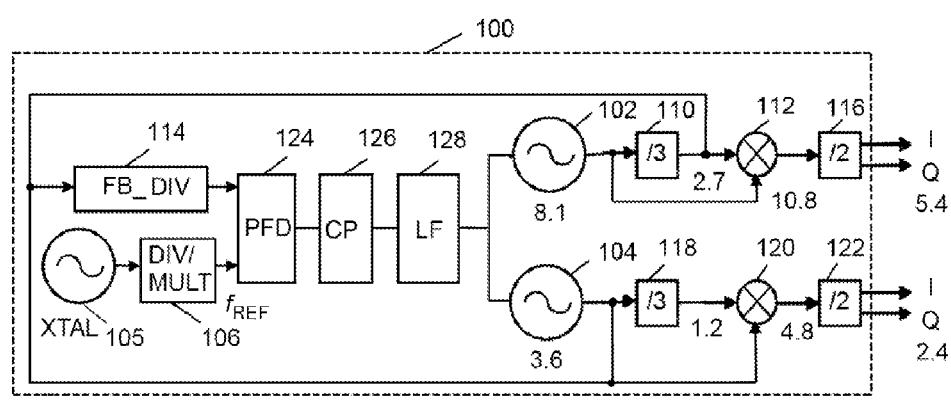
FIG. 1 schematically depicts functional blocks of a dual band frequency synthesizer, according to an embodiment of the invention.

At the outset, it is to be understood that this disclosure is not limited to particularly exemplified materials, architectures, routines, methods or structures as such may, of course, vary. Thus, although a number of such options, similar or equivalent to those described herein, can be used in the practice or embodiments of this disclosure, the preferred materials and methods are described herein.

It is also to be understood that the terminology used herein is for the purpose of describing particular embodiments of this disclosure only and is not intended to be limiting.

The detailed description set forth below in connection with the appended drawings is intended as a description of exemplary embodiments of the present invention and is not intended to represent the only exemplary embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the specification. It will be apparent to those skilled in the art that the exemplary embodiments of the specification may be practiced without these specific details. In some instances, well known structures and devices are shown in block diagram form in order to avoid obscuring the novelty of the exemplary embodiments presented herein.

For purposes of convenience and clarity only, directional terms, such as top, bottom, left, right, up, down, over, above, below, beneath, rear, back, and front, may be used with respect to the accompanying drawings or chip embodiments. These and similar directional terms should not be construed to limit the scope of the invention in any manner.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

"Complementary logic," which refers to logic circuitry involving both P-channel and N-channel transistors, is often more commonly referred to as CMOS (Complementary Metal Oxide Semiconductor) logic even though the transistors making up the logic circuitry may not have metal gates and may not have oxide gate dielectrics. While specific embodiments of this disclosure involve the use of a PMOS gating header switch, the techniques may be applied to a NMOS gating footer switch as desired.

The terms second level and first level, high and low and 1 and 0, as used in the following description may be used to describe various logic states as known in the art. Particular voltage values of the second and first levels are defined arbitrarily with regard to individual circuits. Furthermore, the voltage values of the second and first levels may be defined differently for individual signals such as a clock and a digital data signal. Although specific circuitry has been set forth, it will be appreciated by those skilled in the art that not all of the disclosed circuitry is required to practice the invention. Moreover, certain well known circuits have not been described, to maintain focus on the invention. Similarly, although the description refers to logical "0" and logical "1" or low and high in certain locations, one skilled in the art appreciates that the logical values can be switched, with the remainder of the circuit adjusted accordingly, without affecting operation of the present invention.

Some portions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

Unless defined otherwise, all technical and scientific terms used herein have the same meaning as commonly understood by one having ordinary skill in the art to which the disclosure pertains.

Finally, as used in this specification and the appended claims, the singular forms "a, "an" and "the" include plural referents unless the content clearly dictates otherwise.

As described above, it may be desirable to provide a wireless communications device, such as a receiver, a transmitter, or a transceiver, that operates on more than one frequency band. For example, wireless local area networks (WLANs) adhering to the Institute of Electrical and Electronic Engineers (IEEE) 802.11 protocols may operate on channels associated with, e.g., 2.4 GHz (b/g/n), 3.6 GHz (y), and/or 5 GHz (ac), including 5.4 GHz, frequency bands. Accordingly, a frequency synthesizer may be used to generate the frequencies required for operation in the frequency spectra used by the wireless communications system.

Generally, transmission and reception of a wireless signal involves conversion of a signal between a lower baseband frequency and a higher RF signal, and may include the use of one or more transitional IFs depending upon the design of the communications device. During reception, the incoming RF signal may be mixed with the signal from a Local Oscillator (LO) to down convert the signal either to baseband frequency or to an IF and subsequently down convert the IF to baseband. Similarly, transmission of a baseband signal involves mixing the signal with a LO signal to up convert the signal to RF, so that the signal may be propagated efficiently. In one embodiment, the LO signal used for the mixing operation is provided by a suitable frequency synthesizer, e.g., Phase-Locked Loop (PLL) circuitry. The PLL circuitry receives a reference clock signal from a stable frequency source, e.g., a crystal oscillator (XO), and supplies a control voltage which is used to cause a VCO to output a desired frequency. The design of the PLL circuit includes a feedback path configured to keep the output of the VCO at the desired frequency. Further, the output of the VCO may be multiplied, divided and/or combined with additional frequency signals to generate a final frequency that is used for the down conversion or up conversion process. As a result, it may be desirable to select an operational frequency for a VCO, wherein the selection is based, at least in part, upon the impact of the candidate frequency on the performance of the communications device.

During transmission, an RF output signal is generated that may have a relatively large amplitude. Further, the VCO may be sensitive to re-circulated energy that may result from energy radiated or otherwise conducted by the RF components. Specifically, energy from the RF signal path may couple to the VCO and cause the VCO to deviate from its desired operational frequency (i.e., VCO pulling or frequency pulling). As a result, the VCO may be more sensitive to energy close to its operating frequency, thus degrading performance of the transmitter, particularly when the RF output signal is an integer multiple of VCO's frequency. For example, a VCO for use within the 5.4 GHz WLAN frequency band that operates at 10.8 GHz may be subject to VCO pulling due to the operating frequency being twice the carrier RF. Therefore, in one embodiment, a VCO is employed to operate at a frequency other than an integer multiple of the transmission frequency of the wireless communications system.

In another aspect, a PLL used in a frequency synthesizer may be viewed as a potential source of unwanted interference since oscillating frequency sources such as a PLL may provide unwanted leakage of energy into other circuit elements, creating spurious signals or "spurs." Spurs may occur outside the necessary bandwidth, and may include harmonics, leakage from the local oscillator and other systems within the transmitter, intermodulation products, and frequency conversion products. Thus, electromagnetic coupling (including magnetic coupling involving one or more bondwires and electric coupling involving the supply lines or the substrate) may result in spurious tones appearing at a frequency corresponding to the aggressor signal. Additionally, spurs may also be generated during mixing and dividing operations, placing limits on the number of manipulations that may be desirable.

Further, with the growing popularity of wireless communications systems, multiple systems may be implemented in a single device. For example, a given device may employ any number of additional radio access technologies, including wireless wide area networks (WWANs) such as Radio Transmission Technology (RTT), Global System for Mobile Communications (GSM), Enhanced Data for GSM Evolution (EDGE), Evolution-Data Only (EV-DO), General Packet Radio Service (GPRS), Universal Mobile Telecommunications System (UMTS), High Speed Packet Access (HSPA), Long Term Evolution (LTE), WiMAX and the like, wireless personal area networks (WPANs) that may include BLUETOOTH®, ZigBee®, ultra wide band (UWB), ANT and the like, as well as other wireless systems employing radio frequencies such as Global Positioning System (GPS).

As a result, operation of a frequency source configured for one application may cause undesirable interference in the frequency band of another application, particularly in the form of spurs that may exist at harmonics of the VCO's operating frequency. For example, the output of a VCO operating at 3.6 GHz may be divided to produce quadrature 1.8 GHz signals for the I and Q bands of a WLAN transceiver, but in doing so may generate interference that conflicts with another wireless communication system operating on the 1.8 GHz GSM band. The problems posed by these aggressor signals may be exacerbated by trends in circuit design to integrate multiple analog and digital functions into a single chip, such as in system-on-a-chip (SOC) applications, RF integrated circuits (RFICs), mixed-signal ICs, and the like.

The presence of unwanted spurs and undesirable interference may result in a degradation in performance of the wireless communications system. Additionally, the level of permissible spurious emissions in RF systems may be subject to strict regulatory limits. Thus, reduction, minimization or mitigation of spurs may be an important consideration during design.

Accordingly, one aspect to be considered when designing a frequency synthesizer for a wireless communications device is what spurs may be produced and whether those spurs may violate regulatory requirements or cause unwanted levels of interference in other co-located wireless communications systems. It may be desirable to adopt a frequency plan that minimizes these effects.

With at least the above design considerations in mind, one embodiment of the disclosure describes a frequency synthesizer 100 as schematically depicted in FIG. 1. As shown, frequency synthesizer 100 may be implemented as PLL circuitry having a reference frequency source, such as crystal oscillator (XTAL) 105. Depending upon the characteristics of the reference source, the signal generated by XTAL 105 may be divided or multiplied in block 106 to generate the final reference frequency $f_{REF}$. In other embodiments, XTAL 105 may be configured to directly output a signal at $f_{REF}$.

In this embodiment, frequency synthesizer 100 is configured to generate frequencies in the 2.4 GHz band and in the 5.4 GHz band (e.g., for use in a communications device conforming to 802.11 standards). In one embodiment, frequency synthesizer 100 utilizes two VCOs, VCO 102 and VCO 104, operating at different frequencies. VCO 102 may be configured to operate at frequencies in the range of approximately 7.35 GHz to 8.74 GHz to cover the 5.4 GHz band. Output from VCO 102 is fed to both divide by 3 block 110 and mixer 112 in a sliding IF design. IF output from divide by 3 block 110 is fed to both mixer 112 and feed back divider 114. The IF signal fed to feed back divider 114 may be used to regulate VCO 102, as described below. In the context of VCO 102 operation at 8.1 GHz, a 2.7 GHz IF signal from divide by 3 block 110 is mixed with the 8.1 GHz output from VCO 102 to produce a 10.8 GHz output, which is then divided by two with quadrature divider 116 to generate a 5.4 GHz in-phase (I) LO frequency and a 5.4 GHz quadrature (Q) LO frequency. In this embodiment, VCO 102 operating at frequencies in the range of approximately 7.35 GHz to 8.74 GHz may generate I and Q LO frequencies in the range of approximately 4.9 GHz to 5.825 GHz.

VCO 104 may be configured to operate at frequencies in the range of approximately 3.6 GHz to 3.72525 GHz to cover the 2.4 GHz band. Output from VCO 104 is fed to divide by 3 block 118, mixer 120 and feed back divider 114. Output from divide by 3 block 118 is also fed to mixer 120. In the context of VCO 104 operation at 3.6 GHz, the 1.2 GHz IF signal from the divide by 3 block 118 is mixed with the 3.6 GHz output from VCO 104 to produce a 4.8 GHz output. The resulting signal may be divided by two with quadrature divider 122 to generate a 2.4 GHz I LO frequency and a 2.4 GHz Q LO frequency. In this manner, VCO 102 operating at frequencies in the range of approximately 3.6 GHz to 3.72525 GHz may generate I and Q LO frequencies in the range of approximately 2.4 GHz to 2.4835 GHz.

In the present embodiment, VCO 102 and VCO 104 operate at a non-integer multiple of the respective carrier frequencies (e.g., 4/3). In other embodiments, the divide blocks may be configured to employ a different divisor, allowing for operation of the VCOs at other non-integer multiples, as desired. One consideration in designing the frequency synthesizer 100 may be to allow the reference source, the IF, the mixer products and the quadrature output to operate at conventional 50% duty cycles. Another consideration in designing the frequency synthesizer 100 may be to reduce the number of mixing and dividing operations to correspondingly reduce the opportunities for spurs to be generated.

As shown, an output signal from VCO 102 and VCO 104 is fed to feed back divider 114. The embodiment illustrates, but is not limited to, the output signals being either from divide by 3 block 110 (or 118 for VCO 102) or the direct output from VCO 104 (or 102), to provide regulation of the respective VCOs. In one embodiment, feed back divider 114 divides the signal received from each VCO by an integer or by a fractional value (depending upon the design of the PLL circuitry) to generate a control signal that is compared to $f_{REF}$ by phase frequency detector (PFD) 124. In an integer-N PLL, feed back divider 114 may divide the output signal from divide by 3 block 110 by an integer, $N_1$, such that $f_{REF} \cdot N_1 \cdot 3 = 8.1$ GHz and feed back divider 114 may divide the output signal from VCO 104 by an integer, $N_2$, such that $f_{REF} \cdot N_2 = 3.6$ GHz. In a fractional-N PLL, feed back divider 114 may divide the output signal from divide by 3 block 110 by an integer, $N_1$ and fractional $\alpha_1$, wherein $0<\alpha_1<1$, such that $f_{REF} \cdot (N_1+\alpha_1) \cdot 3 = 8.1$ GHz and feed back divider 114 may divide the output signal from VCO 104 by an integer, $N_2$ and fractional $\alpha_2$, wherein $0<\alpha_2<1$, such that $f_{REF} \cdot (N_2+\alpha_2) = 3.6$ GHz, for example through use of a dual modulus divider.

Depending upon the difference between $f_{REF}$ and the feedback signal, PFD 124 may generate an error signal in the form of a series of voltage pulses having a duty cycle proportional to the phase difference between the input signals. The error signal is output to charge pump (CP) 126 which converts the voltage pulses output by PFD 124 to current pulses having a predefined amplitude. In turn, loop filter (LF) 128 converts the current pulses to a low pass filtered voltage signal that may be applied to either VCO 102 or VCO 104, depending upon which frequency band is being used, to drive the operational frequency of the VCO to the desired value. Thus, although separate VCOs are employed, they may share a common regulatory path including feed back divider 114, PFD 124, CP 126 and LF 128. Further, the reference frequency source (XTAL 105) may also be shared.

In the illustrated embodiment, frequency synthesizer 100 employs a frequency plan involving operations of the VCOs at frequencies that are non-integer multiples of the respective carrier frequencies to reduce VCO pulling effects (i.e., VCO 102 operates at frequencies around 8.1 GHz, which is 4/3 of the 5.4 GHz carrier frequency, and VCO 104 operates at frequencies around 3.6 GHz, which is likewise 4/3 of the 2.4 GHz carrier frequency).

Other benefits of embodiments in the disclosure (e.g., regarding the frequency synthesizer 100) may be recognized by assessing the potential for interference resulting from operation of the VCOs at the designed frequency. In particular, operation of VCO 102 around 8.1 GHz and VCO 104 around 3.6 GHz may be evaluated with regard to the effect any spurs present at those frequencies may have on regulatory requirements and on other wireless communications systems.

In one aspect, frequency synthesizer 100 may experience spurs generated by the operation of mixer 112 and mixer 120. However, these image frequencies occur at the RF frequency, either 5.4 GHz or 2.4 GHz, respectively. As a result, they may be manifest in the operation of a transceiver as I/Q imbalance rather than spurious frequencies that must be filtered or otherwise mitigated. The corresponding I/Q imbalance may be corrected using conventional techniques.

Further, as described above, spurs resulting from operation of oscillating circuits such as VCO 102 and VCO 104 and non-linearities in other components may appear in the output of a transmitter employing frequency synthesizer 100. Correspondingly, regulatory authorities have established limits with regard to the emission of unintended frequencies. For example, emissions requirements are set by the Federal Communications Commission (FCC) for the United States and by the European Telecommunications Standards Institute (ETSI) for Europe. Tables 1 and 2 provide simulated levels of spurs generated by operation of VCO 102 at 8.1 GHz and VCO 104 at 3.6 GHz, respectively, using simulated front end (FE) selectivity levels as compared to ETSI and FCC specifications. The simulations were performed with conducted limits for ETSI of −47 dBm/100 kHz, −36 dBm/100 kHz and −30 dBm/100 kHz and for FCC of −46 dBm/MHz and −41.25 dB/MHz. These results show that operation at either frequency band resulted in no relevant spurs being generated or that the power of any emitted spurs was below the corresponding ETSI or FCC specifications.

TABLE 1

| Absolute Range | FE Selectivity | ETSI LO Specification | Spurs | Simulated Level |
|---|---|---|---|---|
| 1000 MHz-1800 MHz | 54 dB | 0.0 dBc | N/A | N/A |
| 1900 MHz-2400 MHz | 54 dB | 0.0 dBc | N/A | N/A |
| 2483.5 MHz-5150 MHz | 0 dB | −23.0 dBc | 1 | −54 dBc |
| 5725 MHz-12750 MHz | 0 dB | −23.0 dBc | 3 | −57 dBc |

| Absolute Range | FE Selectivity | FCC LO Specification | Spurs | Simulated Level |
|---|---|---|---|---|
| 2200 MHz-2300 MHz | 68 dB | 0.0 dBc | N/A | |
| 2310 MHz-2390 MHz | 68 dB | 0.0 dBc | N/A | |
| 2655 MHz-2900 MHz | 40 dB | 0.0 dBc | 1 | −54 dBc |
| 3600 MHz-4400 MHz | 15 dB | −26.0 dBc | N/A | |
| 4500 MHz-5150 MHz | 0 dB | −49.4 dBc | N/A | |
| 7250 MHz-7750 MHz | 15 dB | −26.0 dBc | N/A | |
| 10360 MHz-11650 MHz | 30 dB | 0.0 dBc | 4 | −40 dBc |
| 15540 MHz-17475 MHz | 40 dB | 0.0 dBc | 6 | −15 dBc |

TABLE 2

| Absolute Range | FE Selectivity | ETSI LO Specification | Spurs | Simulated Level |
|---|---|---|---|---|
| 30 MHz-1000 MHz | 18 dB | 0.0 dBc | N/A | N/A |
| 1000 MHz-1800 MHz | 5 dB | 0.0 dBc | 1 | −54 dBc |
| 1900 MHz-2400 MHz | 0 dB | −34.2 dBc | N/A | N/A |
| 2483.5 MHz-5150 MHz | 0 dB | −34.2 dBc | 3 | −58 dBc |
| 5300 MHz-12750 MHz | 35 dB | 0.0 dBc | 5 | −61 dBc |

| Absolute Range | FE Selectivity | FCC LO Specification | Spurs | Simulated Level |
|---|---|---|---|---|
| 30 MHz-1000 MHz | 18 dB | −3.6 dBc | N/A | N/A |
| 2655 MHz-2900 MHz | 0 dB | −31.8 dBc | N/A | N/A |
| 3600 MHz-4400 MHz | 20 dB | −9.8 dBc | 3 | −58 dBc |
| 4500 MHz-5150 MHz | 30 dB | 0.0 dBc | 4 | −40 dBc |
| 5350 MHz-5460 MHz | 35 dB | 0.0 dBc | N/A | N/A |
| 7250 MHz-7750 MHz | 40 dB | 0.0 dBc | 6 | −15 dBc |
| 4824 MHz-4924 MHz | 30 dB | 0.0 dBc | 4 | −40 dBc |
| 7236 MHz-7386 MHz | 40 dB | 0.0 dBc | 6 | −15 dBc |
| 9648 MHz-9848 MHz | 40 dB | 0.0 dBc | 8 | −40 dBc |

The frequency plan for frequency synthesizer 100 may be evaluated for transmission coexistence with other wireless communications systems and GPS. Tables 3 and 4 illustrate the simulated band noise resulting from a transmitter employing frequency synthesizer 100 with VCO 102 operating at 8.1 GHz and VCO 104 operating at 3.6 GHz, respectively. The LO specifications shown are based upon a maximum desensitization of 1 dB in the coexistence target with 12 dB of antenna isolation. Table 3 shows that potentially interfering spurs resulted from operation of the transmitter in the IMT-E band, the 2.6 GHz band and the 2.7 GHz band, but no simulated spur levels exceed the LO specifications. Table 4 shows that only one potentially interfering spur resulted from operation of the transmitter in the B43 band. Although the simulated level of the interfering spur exceeds the LO specification, the B43 band may be viewed as a relatively low priority band. Accordingly, operation of frequency synthesizer 100 with respect to transmission presents fewer coexistence issues with other wireless frequency bands than conventional techniques.

TABLE 3

| Band | Protected Range | FE Select. | LO Specification | Spurs | Simulated Level |
|---|---|---|---|---|---|
| IMT (2100) | 2110 MHz-2170 MHz | 56 dB | −20.9 dBc | N/A | N/A |
| PCS (1900) | 1930 MHz-1990 MHz | 54 dB | −22.9 dBc | N/A | N/A |
| AWS | 2110 MHz-2155 MHz | 56 dB | −20.9 dBc | N/A | N/A |
| IMT-E | 2620 MHz-2690 MHz | 50 dB | −26.9 dBc | 1 | −58 dBc |
| EAWS | 2110 MHz-2170 MHz | 56 dB | −20.9 dBc | N/A | N/A |
| PCS + G | 1930 MHz-1995 MHz | 54 dB | −22.9 dBc | N/A | N/A |
| B34 (S band) | 2010 MHz-2025 MHz | 54 dB | −22.9 dBc | N/A | N/A |
| B36 | 1930 MHz-1990 MHz | 54 dB | −22.9 dBc | N/A | N/A |
| 2.6 GHz | 2570 MHz-2620 MHz | 50 dB | −26.9 dBc | 1 | −58 dBc |
| 2.3 GHz (IMT-2000) | 2300 MHz-2400 MHz | 68 dB | −8.9 dBc | N/A | N/A |
| 2.7 GHz | 2496 MHz-2690 MHz | 50 dB | −26.9 dBc | 1 | −58 dBc |
| B42 | 3400 MHz-3600 MHz | 29 dB | −59.9 dBc | N/A | N/A |

TABLE 4

| Band | Protected Range | FE Select. | LO Specification | Spurs | Simulated Level |
|---|---|---|---|---|---|
| PCS (1900) | 1930 MHz-1990 MHz | 5 dB | −72.5 dBc | N/A | N/A |
| PDC (1500) | 1476 MHz-1496 MHz | 11 dB | −66.5 dBc | N/A | N/A |
| PCS + G | 1930 MHz-1995 MHz | 5 dB | −72.5 dBc | N/A | N/A |
| B36 | 1930 MHz-1990 MHz | 5 dB | −72.5 dBc | N/A | N/A |
| B37 | 1910 MHz-1930 MHz | 5 dB | −72.5 dBc | N/A | N/A |
| B42 | 3400 MHz-3600 MHz | 10 dB | −82.5 dBc | N/A | N/A |
| B43 | 3600 MHz-3800 MHz | 10 dB | −82.5 dBc | 3 | −57 dBc |
| 450M | 463 MHz-493 MHz | 35 dB | −42.5 dBc | N/A | N/A |
| 400 MHz EU PAMR | 463 MHz-493 MHz | 35 dB | −42.5 dBc | N/A | N/A |

Further, the frequency plan for frequency synthesizer 100 may be evaluated for reception coexistence with other wireless communications systems and GPS. Tables 5 and 6 illustrate the simulated blocking interference in a receiver employing frequency synthesizer 100 with VCO 102 operating at 8.1 GHz and VCO 104 operating at 3.6 GHz, respectively. The LO specifications shown are based upon a maximum desensitization of 0.3 dB in the coexistence target with 12 dB of antenna isolation. Table 5 shows that potentially blocking spurs resulted from operation of the receiver in the IMT-E band, the 2.6 GHz band and the 2.7 GHz band, and that simulated spur levels exceed the LO specifications by approximately 6 dB, representing only modest interference. Table 6 shows that one potentially interfering spur resulted from operation of the receiver in the B43 band with the simulated level of the interfering spur exceeding the LO specification. However, as discussed above the B43 band may be considered a relatively low priority band. Accordingly, operation of frequency synthesizer 100 with respect to reception also presents minimal coexistence issues with other wireless frequency bands.

TABLE 5

| Band | Protected Range | FE Select. | LO Specification | Spurs | Simulated Level |
|---|---|---|---|---|---|
| IMT (2100) | 1920 MHz-1980 MHz | 24 dB | −62 dBc | N/A | N/A |
| IMT-E | 2500 MHz-2570 MHz | 23 dB | −63 dBc | 1 | −58 dBc |
| B34 (S band) | 2010 MHz-2025 MHz | 23 dB | −63 dBc | N/A | N/A |
| B36 | 1930 MHz-1990 MHz | 24 dB | −62 dBc | N/A | N/A |
| 2.6 GHz | 2570 MHz-2620 MHz | 22 dB | −64 dBc | 1 | −58 dBc |
| 2.3 GHz (IMT-2000) | 2300 MHz-2380 MHz | 23 dB | −63 dBc | N/A | N/A |
| 2.7 GHz | 2496 MHz-2690 MHz | 22 dB | −64 dBc | 1 | −58 dBc |
| B42 | 3400 MHz-3600 MHz | 18 dB | −68 dBc | N/A | N/A |

TABLE 6

| Band | Protected Range | FE Select. | LO Specification | Spurs | Simulated Level |
|---|---|---|---|---|---|
| IMT (2100) | 1920 MHz-1980 MHz | 9 dB | −75 dBc | N/A | N/A |
| PDC (1500) | 1428 MHz-1448 MHz | 13 dB | −71 dBc | N/A | N/A |
| PDC | 1448 MHz-1463 MHz | 13 dB | −71 dBc | N/A | N/A |
| B36 | 1930 MHz-1990 MHz | 9 dB | −75 dBc | N/A | N/A |
| B37 | 1910 MHz-1930 MHz | 9 dB | −75 dBc | N/A | N/A |
| B42 | 3400 MHz-3600 MHz | 10 dB | −65 dBc | N/A | N/A |
| B43 | 3600 MHz-3800 MHz | 10 dB | −65 dBc | 3 | −57 dBc |
| 450M | 453 MHz-483 MHz | 27 dB | −57 dBc | N/A | N/A |
| 400 MHz EU PAMR | 453 MHz-489 MHz | 27 dB | −57 dBc | N/A | N/A |

In another aspect, frequency synthesizer 100 is shown to employ two VCOs. An advantage associated with this architecture is that characteristics of VCO 102 and VCO 104 may be individually tailored to suit their respective applications. For example, VCO 102 may be configured for operation in the 5.4 GHz WLAN frequency band. Such uses may be associated with relatively greater sensitivity to phase noise and may benefit from the use of a frequency synthesizer that exhibits relatively less phase noise. On the other hand, VCO 104 may be configured for operation in the 2.4 GHz WLAN frequency band, which may not require as stringent phase noise from the frequency synthesizer as the 5.4 GHz WLAN frequency band. Accordingly, in one embodiment, VCO 102 may be implemented with smaller inductance than VCO 104 to improve phase noise performance while VCO 104 may be implemented with greater inductance than VCO 102 to improve power efficiency. In one embodiment, VCO 104 may also employ a two-turn inductor to reduce the area requirement. In another embodiment, VCO 104 may be implemented with a relatively smaller capacitor bank than conventional VCOs.

To help illustrate representative power savings that may be achieved using the two VCO design of frequency synthesizer 100, Table 7 compares current consumption for operation at 2.4 GHz mode and 5.4 GHz mode. By tailoring characteristics of VCO 102 and VCO 104 as described above, the current used by the core of VCO 104 may be approximately 2 mA less than a VCO configured to operate at both frequencies. Further, the current consumed by the PLL circuitry in 2.4 GHz mode using VCO 104 may be approximately 1 mA less than PLL circuitry employing a single VCO. Accordingly, the dual VCO design of frequency synthesizer 100 may realize a net savings of approximately 3 mA or 17% as compared to frequency synthesizer having one VCO. The area occupied by the dual VCO design of frequency synthesizer 100 may be approximately 0.065 mm$^2$ more than a single VCO design, based upon a 40 nm process, representing a small area penalty relative to the power savings that may be achieved.

TABLE 7

|  | 2.4 GHz Mode | 5.4 GHz Mode |
|---|---|---|
| VCO Core[mA] | 6.5 | 8.5 |
| PLL [mA] | 5 | 6 |
| LO-Gen [mA] | 6 | 5 |
| Total [mA] | 17.5 | 19.5 |
| Area [mm$^2$] | 0.395 mm | |

Figure 2:
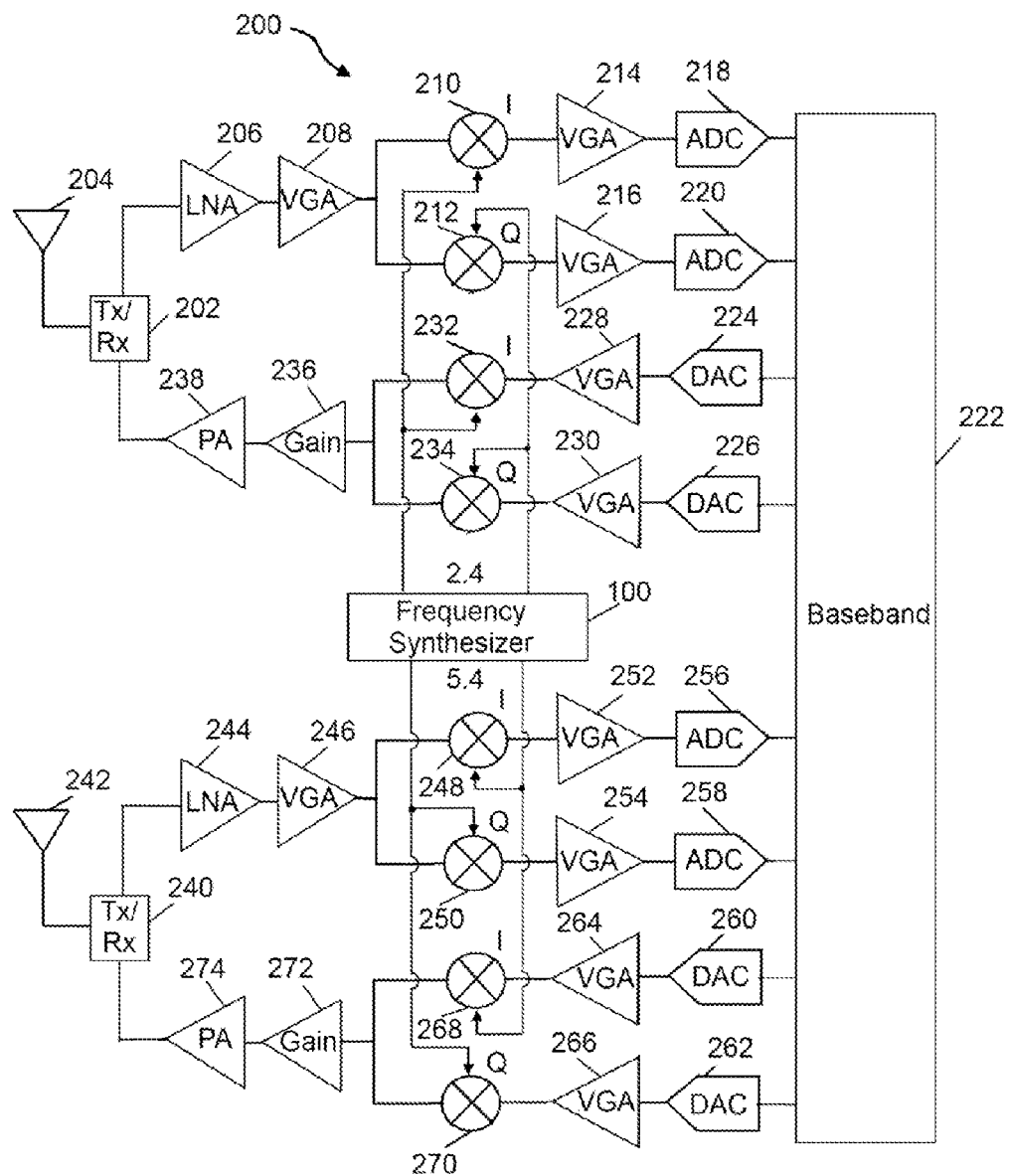
FIG. 2 schematically depicts functional blocks of a wireless transceiver incorporating the frequency synthesizer of FIG. 1, according to an embodiment of the invention.

As described above, frequency synthesizer 100 may be configured for use in a wireless communications device. In one embodiment, frequency synthesizer 100 may be incorporated in dual band wireless transceiver 200 as shown in FIG. 2. Generally, each band includes a transmit and receive chain. First, with respect to the 2.4 GHz band, a transmit/receive (Tx/Rx) switch 202 couples antenna 204 to either the receive chain or transmit chain as warranted by operation of transceiver 200. The receive chain may include low noise amplifier (LNA) 206 and by variable gain amplifier (VGA) 208. I and Q 2.4 GHz outputs from frequency synthesizer 100 down convert and separate the incoming signal to quadrature components at baseband frequency at mixer 210 and mixer 212, respectively. Each quadrature component may then be amplified by VGA 214 and VGA 216, respectively. The output from the VGAs is converted to digital by analog to digital converter (ADC) 218 and ADC 220, respectively, and supplied to the baseband circuitry 222.

Similarly, the transmit chain may include quadrature digital signals output from baseband circuitry 222 that are converted to analog by digital to analog converter (DAC) 224 and DAC 226, respectively, and gain adjusted by VGA 228 and VGA 230, respectively. The quadrature baseband components are then up converted to RF by mixer 232 and mixer 234 using the 2.4 GHz I and Q outputs from frequency synthesizer 100. The RF combined signal is amplified by gain stage 236 and fed to power amplifier (PA) 238. The output from PA 238 is coupled through switch 202 to antenna 204 for transmission.

In one embodiment, the receive and transmit chains for the 5.4 GHz band may be implemented in a similar manner to the receive and transmit chains for the 2.4 GHz band. In particular, Tx/Rx switch 240 couples antenna 242 to the receive and transmit chains. An incoming signal for the receive chain is fed through LNA 244 and VGA 246. I and Q 2.4 GHz outputs from frequency synthesizer 100 down convert and separate the incoming signal to quadrature components at mixer 248 and mixer 250. Each quadrature component may then be amplified by VGA 252 and VGA 254, converted by ADC 256 and ADC 258 and fed to baseband circuitry 222. Quadrature component digital signals for transmission from baseband circuitry 222 are converted by DAC 260 and DAC 262 and amplified by VGA 228 and VGA 230, respectively. The quadrature signals are then modulated onto the I and Q 2.4 GHz outputs from frequency synthesizer 100 by mixer 268 and mixer 270. The combined signal is then amplified by gain stage 272, fed to PA 274 and coupled to antenna 242 through switch 240 for transmission.

Figure 3:
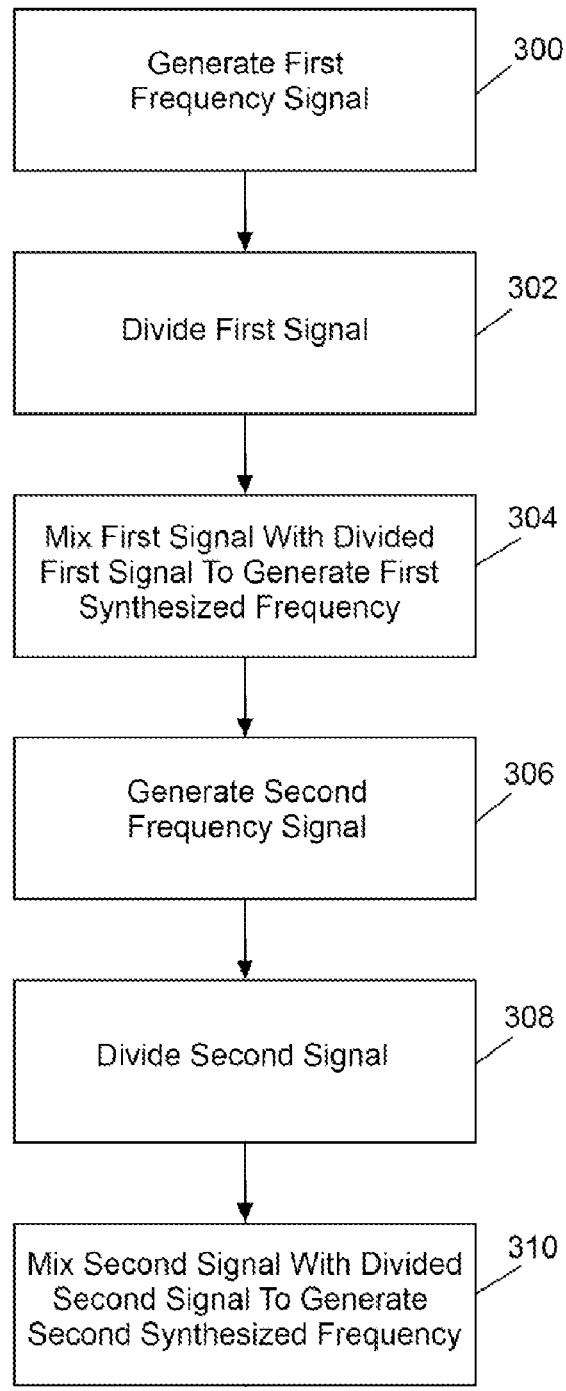
FIG. 3 is a flowchart representing a routine for synthesizing frequencies, according to an embodiment of the invention.

To help illustrate aspects of this disclosure, an exemplary routine for synthesizing frequencies is represented by the flowchart depicted in FIG. 3. As shown, the routine may begin at step 300 by generating a first signal having a frequency with a first VCO, such as VCO 102. Next, the first signal may be divided in step 302 by a first divide block and mixed with an output of the first divide block in step 304 to generate a first synthesized signal having a frequency that is a non-integer multiple of the frequency of the first signal. Similarly, the routine may continue in step 306 by generating a second signal having a frequency with a second VCO, such as VCO 104. The second signal may be divided in step 308 by a second divide block and mixed with an output of the second divide block in step 310 to generate a second synthesized signal having a frequency that is a non-integer multiple of the frequency of the second signal.

The embodiments described above are provided for illustration only and should not limit any aspect of other embodiments. For example, frequency synthesizer 100 may be utilized in any suitable wireless communications device, including receivers, transmitters and other transceivers as desired, and the embodiment illustrated in transceiver 200 is provided as a representative only. Accordingly the embodiments described herein are presently only some embodiments of the invention. One skilled in the art that pertains to the present invention will understand that the principles of this disclosure can be extended easily to other embodiments.

What is claimed is:

1. A frequency synthesizer, comprising:
   a first voltage controlled oscillator (VCO) to generate a signal having a first frequency;
   a first mixer coupled to the first VCO;
   a first divide block, coupled to the first VCO and the first mixer to output a first feedback signal for controlling the first VCO, and
   a divided signal to the first mixer;
   a second VCO to generate a signal having a second frequency and to output a second feed back signal for controlling the second VCO;
   a second mixer coupled to the second VCO; and
   a second divide block, coupled to the second VCO and the second mixer, to output a divided signal to the second mixer;
   wherein the first VCO to output the signal having the first frequency to the first divide block and to the first mixer, the first mixer to generate a first synthesized signal having a frequency that is a non-integer multiple of the first frequency, comprising combining the divided signal from the first divide block with the signal having the first frequency,
   the second VCO to output the signal having the second frequency to the second divide block and to the second mixer, and
   the second mixer to generate a second synthesized signal having a frequency that is a non-integer multiple of the second frequency, comprising combining the divided signal from the second divide block with the signal having the second frequency.

2. The frequency synthesizer of claim 1, further comprising:
   a first quadrature divide by two block coupled to the first mixer, to:
      receive the first synthesized signal from the first mixer, and
      generate using the first synthesized signal:
         a first in-phase (I) local oscillator signal at one-half the frequency of the first synthesized signal; and
         a first quadrature (Q) local oscillator signal at one-half the frequency of the first synthesized signal; and
   a second quadrature divide by two block, coupled to the second mixer, to:
      receive the second synthesized signal from the second mixer, and
      generate using the second synthesized signal:
         a second I local oscillator signal at one-half the frequency of the second synthesized signal, and
         a second Q local oscillator signal at one-half the frequency of the second synthesized signal.

3. The frequency synthesizer of claim 2, wherein the first and second divide blocks comprise divide by three blocks.

4. The frequency synthesizer of claim 3, wherein the first I and Q local oscillator signals each have a frequency ⅔ of the first frequency and wherein the second I and Q local oscillator signals each have a frequency ⅔ of the second frequency.

5. The frequency synthesizer of claim 4, wherein the first frequency is in the range of approximately 7.35 GHz to 8.74 GHz and wherein the second frequency is in the range of approximately 3.6 GHz to 3.72525 GHz.

6. The frequency synthesizer of claim 1, further comprising a common regulatory path.

7. The frequency synthesizer of claim 6, wherein the common regulatory path to receive the first feed back signal from the first divide block and the second feed back signal from the second VCO.

8. The frequency synthesizer of claim 1, wherein the second VCO to exhibit less phase noise than the first VCO.

9. The frequency synthesizer of claim 8, wherein the first VCO has a first inductance and the second VCO has a second inductance, such that the second inductance is less than the first inductance.

10. A method for synthesizing frequencies comprising:
generating a first signal having a first frequency with a first voltage controlled oscillator (VCO);
dividing the first signal with a first divide block to create a first divided signal;
outputting a first feed back signal from the first divide block for controlling the first VCO;
mixing the first signal with the first divided signal to generate a first synthesized signal having a frequency that is a non-integer multiple of the first frequency;
generating a second signal having a second frequency with a second VCO;
outputting a second feed back signal from the second VCO for controlling the second VCO;
dividing the second signal with a second divide block to create a second divided signal; and
mixing the second signal with the second divided signal to generate a second synthesized signal having a frequency that is a non-integer multiple of the second frequency.

11. The method of claim 10, further comprising:
dividing the first synthesized signal with a first quadrature divide by two block to generate a first in-phase (I) local oscillator signal at one-half the frequency of the first synthesized signal and a first quadrature (Q) local oscillator signal at one-half the frequency of the first synthesized signal; and
dividing the second synthesized signal with a second quadrature divide by two block to generate a second I local oscillator signal at one-half the frequency of the second synthesized signal and a second quadrature Q local oscillator signal at one-half the frequency of the second synthesized signal.

12. The method of claim 11, wherein dividing the first signal with the first divide block comprises dividing by three and dividing the second signal with the second divide block comprises dividing by three.

13. The method of claim 12, wherein dividing the first synthesized signal with the first quadrature divide by two block generates first I and Q local oscillator signals at ⅔ of the frequency of the first signal and dividing the second synthesized signal with the second quadrature divide by two block generates second I and Q local oscillator signals at ⅔ of the frequency of the second signal.

14. The method of claim 13, wherein the first frequency is in the range of approximately 7.35 GHz to 8.74 GHz and wherein the second frequency is in the range of approximately 3.6 GHz to 3.72525 GHz.

15. The method of claim 10, further comprising controlling the first and second VCOs with a common regulatory path.

16. The method of claim 15, further comprising taking the first feed back signal for the common regulatory path from the first divide block and taking the second feed back signal for the common regulatory path from the second VCO.

17. The method of claim 10, wherein the second VCO exhibits less phase noise than the first VCO.

18. The method of claim 17, wherein the first VCO has a first inductance and the second VCO has a second inductance, such that the second inductance is less than the first inductance.

* * * * *